(12) United States Patent
Liu et al.

(10) Patent No.: US 8,058,123 B2
(45) Date of Patent: Nov. 15, 2011

(54) INTEGRATED CIRCUIT AND METHOD OF FABRICATION THEREOF

(75) Inventors: Jinping Liu, Singapore (SG); Hai Cong, Singapore (SG); Binbin Zhou, Singapore (SG); Alex K H See, Singapore (SG); Mei Sheng Zhou, Singapore (SG); Liang Choo Hsia, Singapore (SG)

(73) Assignee: Globalfoundries Singapore Pte. Ltd., Singapore (SG)

( * ) Notice: Subject to any disclaimer, the term of this patent is extended or adjusted under 35 U.S.C. 154(b) by 493 days.

(21) Appl. No.: 11/946,843

(22) Filed: Nov. 29, 2007

(65) Prior Publication Data

US 2009/0140292 A1 Jun. 4, 2009

(51) Int. Cl.
*H01L 21/8238* (2006.01)

(52) U.S. Cl. ........ 438/230; 438/233; 257/296; 257/327; 257/311

(58) Field of Classification Search ................ 438/230, 438/233; 257/296, 327, 311
See application file for complete search history.

(56) References Cited

U.S. PATENT DOCUMENTS

| | | | |
|---|---|---|---|
| 6,492,216 B1 | 12/2002 | Yeo et al. | |
| 6,867,428 B1 | 3/2005 | Besser et al. | |
| 6,921,913 B2 | 7/2005 | Yeo et al. | |
| 7,052,946 B2 | 5/2006 | Chen et al. | |
| 7,172,933 B2 | 2/2007 | Huang et al. | |
| 2002/0074579 A1* | 6/2002 | Hasunuma | 257/288 |
| 2004/0126998 A1 | 7/2004 | Feudel et al. | |
| 2004/0262784 A1* | 12/2004 | Doris et al. | 257/900 |
| 2006/0145289 A1 | 7/2006 | Yu | |
| 2006/0163647 A1 | 7/2006 | Toda et al. | |
| 2006/0244074 A1 | 11/2006 | Chen et al. | |
| 2006/0246672 A1 | 11/2006 | Chen et al. | |
| 2007/0001233 A1* | 1/2007 | Schwan et al. | 257/369 |
| 2007/0013010 A1 | 1/2007 | Wang et al. | |
| 2007/0057287 A1 | 3/2007 | Lin et al. | |
| 2008/0003746 A1* | 1/2008 | Curello et al. | 438/258 |
| 2008/0142879 A1* | 6/2008 | Chong et al. | 257/327 |
| 2009/0189193 A1* | 7/2009 | Curello et al. | 257/202 |

FOREIGN PATENT DOCUMENTS

| | | |
|---|---|---|
| WO | WO2004/068586 A1 | 8/2004 |
| WO | WO2005/017964 A2 | 2/2005 |
| WO | WO2005/043591 A2 | 5/2005 |

* cited by examiner

*Primary Examiner* — Matthew Smith
*Assistant Examiner* — John M Parker
(74) *Attorney, Agent, or Firm* — Horizon IP Pte Ltd (57) ABSTRACT

A method of forming an integrated circuit structure comprising the steps of forming a first and second device region on a surface of a wafer, forming a spacer of a first width on a sidewall of a first gate stack in the first device region, forming a spacer of a second width on a sidewall of a second gate stack in the second device region, with the first width being different from the second width.

24 Claims, 14 Drawing Sheets

INTEGRATED CIRCUIT AND METHOD OF FABRICATION THEREOF

FIELD OF THE INVENTION

The present invention relates to integrated circuits (ICs) and a method of fabricating an integrated circuit. In particular, but not exclusively, the invention relates to integrated circuits having NFET and PFET transistor devices.

DESCRIPTION OF THE RELATED ART

In conventional integrated circuit integration schemes, spacers are formed on sidewalls of the gate stacks of NFET and PFET devices by forming a blanket layer over the wafer, and selectively etching the layer to form such spacers.

As device dimensions continue to decrease, it becomes more and more difficult to control the profiles of source and drain junctions and source and drain extensions associated with the devices. One reason for this is that the dopants used for respective junctions (such as arsenic and boron) have different diffusion characteristics in silicon. Junction profiles may be severely degraded during thermal processing of a device due to diffusion. Differences in junction profiles between NFET and PFET devices can result in increased differences between NFET and PFET device performance characteristics.

In order to improve the performance of FET devices as device dimensions continue to decrease, stressors may be introduced into each device in order to apply a strain to the channel region of the device. Stressors may be formed by implanting a dopant into the wafer in the vicinity of the source/drain regions of a device. Alternatively, stressors may be formed by etching a recess in the source/drain regions, and forming a stressor material in the recess. Strain may also be applied to the channel region of a device by coating the device with a strained layer of material.

In the case of PFET devices, stressors that cause a compressive stress to be developed in the channel region are found to enhance the performance of the device. Such stressors generally comprise an epitaxial material having a larger lattice constant than the substrate material. In the case of a PFET device formed in a silicon wafer, the stressor material may be epitaxial silicon germanium.

In the case of NFET devices, stressors that cause a tensile stress to be developed in the channel region are found to enhance the performance of the device. Such stressors generally comprise a material having a smaller lattice constant than the substrate material. In the case of an NFET device formed in a silicon wafer, the stressor material may be epitaxial silicon carbide alloy.

In order to form stressor recesses, etching of the substrate is required. Etching of the substrate to form stressor recesses is usually performed after forming spacers on sidewalls of the gate stacks of the FET devices.

SUMMARY OF THE INVENTION

It is an aim of embodiments of the present invention to at least partly mitigate at least some of the above mentioned problems. According to a first aspect of the invention, there is provided a method of forming an integrated circuit structure comprising the steps of forming a first and second device region on a surface of a wafer, forming a spacer of a first width on a sidewall of a first gate stack in the first device region, forming a spacer of a second width on a sidewall of a second gate stack in the second device region, with the first width being different from the second width.

According to a second aspect of the invention, the formation of the respective spacers is followed by the formation, in the same processing run, of stressor elements for applying a stress to the respective channel regions corresponding with the first and second gate stacks. The stressor elements for applying the aforementioned stress to the respective channel regions may be stressors in the source and drain regions of the respective gate stacks or stressor layers over the respective channel regions.

By providing FET devices having different thicknesses of gate stack sidewall spacer it is possible to control a distance between a stressor member and a channel region of each FET device. Thus, in the case that source and drain stressor elements are formed in source and drain stressor regions of each FET device, the distance between respective stressor elements and the channel region of the FET device will be proportional to the thickness of the respective gate stack sidewall spacer.

In the case that a stressor layer is formed to coat the FET device, the distance between the stressor layer and the channel region of the FET device will also be proportional to the thickness of the gate stack sidewall spacers. Thus, by providing an integrated circuit structure and a method of fabricating an integrated circuit structure having gate stack sidewall spacers of different thicknesses on different respective types of FET devices, different stresses may be applied to the channel regions of different respective types of devices.

It will be appreciated that reference to gate stack sidewall spacers of different thicknesses does not include reference to gate stack sidewall spacers of nominally the same thickness but having very small differences in thickness between devices of the same type due to expected variations in process uniformity.

BRIEF DESCRIPTION OF THE DRAWINGS

Embodiments of the present invention will now be described hereinafter, by way of example only, with reference to the accompanying drawings, in which.

DETAILED DESCRIPTION OF THE INVENTION

The following embodiments are intended to illustrate the invention more fully without limiting their scope, since numerous modifications and variations will be apparent to those skilled in the art.

Figure 1:
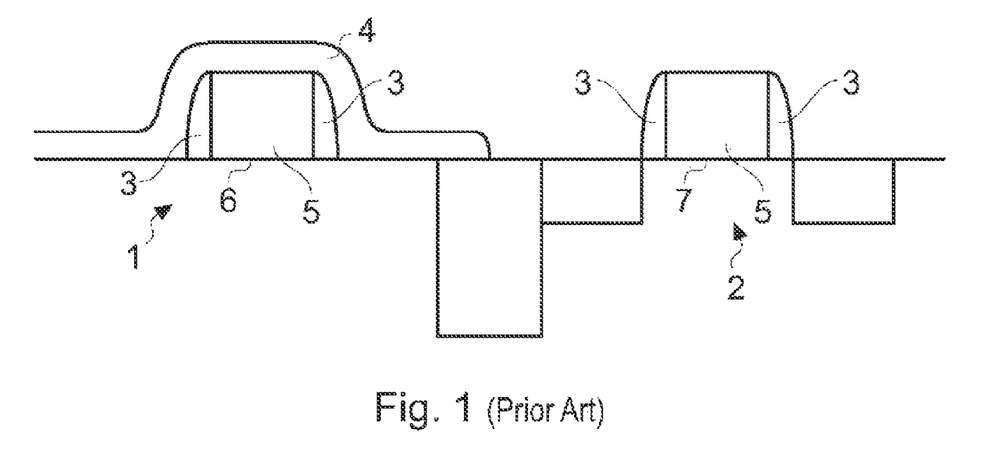
FIG. 1 shows a structure formed during a process of fabricating an integrated circuit according to the prior art.

FIG. 1 illustrates a structure formed during a process of fabricating an integrated circuit according to the prior art. The structure includes an array of NFET devices 1 and an array of PFET devices 2. Gate stack sidewall spacer elements 3 are formed on sidewalls of a gate stack structure 5 of each device.

According to the prior art process, the spacers 3 are formed to have the same thickness as each other.

Furthermore, according to the prior art, stressors are formed in the source and drain region of each device in order to form strained channel MOSFET devices. In the case of NFET devices, stressors are formed to apply a tensile stress to the channel region 6 of each of the NFET devices. In the case of PFET devices, stressors are formed to apply a compressive stress to the channel region 7 of each of the PFET devices.

The stressors may be formed by implantation of a material. Alternatively stressors may be formed by etching a stressor recess and forming a stressor material in the stressor recess. In a still further alternative, stressors may be formed by depositing a layer of stressor material 4 over each of the FET devices.

FIGS. 2 to 7 illustrate structures formed during a process of fabrication of an integrated circuit in accordance with a first embodiment of the present invention.

Figure 2:
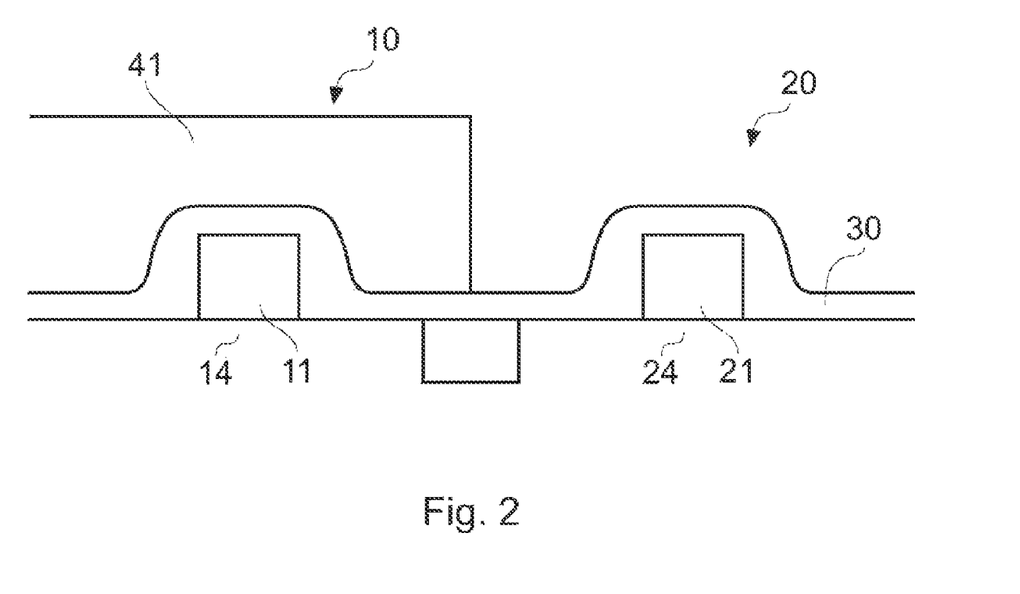
FIGS. 2 to 7 show structures formed during a process of fabricating an integrated circuit according to embodiments of the invention.

FIG. 2 shows an integrated circuit structure having an array of NFET device elements 10 and an array of PFET device elements 20 (only one device of each array is shown). It should be understood that while the specification refers to an array of device elements, this is merely to reflect what is the norm in current industry practice and as shown in the figures, the invention applies to integrated circuit structures having one NFET device and one PFET device also.

Each device element of the arrays of device elements 10, 20 has a respective gate stack structure 11, 21 and a respective channel region 14, 24.

A first layer of a first material 30 is formed over the arrays of device elements 10, 20. The first material is a material from which spacer elements will be formed on the sidewalls of the gate stack structures 11, 21.

According to the first embodiment, the first material may be silicon nitride. In some embodiments silicon oxide may be used instead, or a combination of silicon oxide and silicon nitride. Other isolating, low-k materials compatible with CMOS processing and combinations thereof are also useful.

Figure 3:
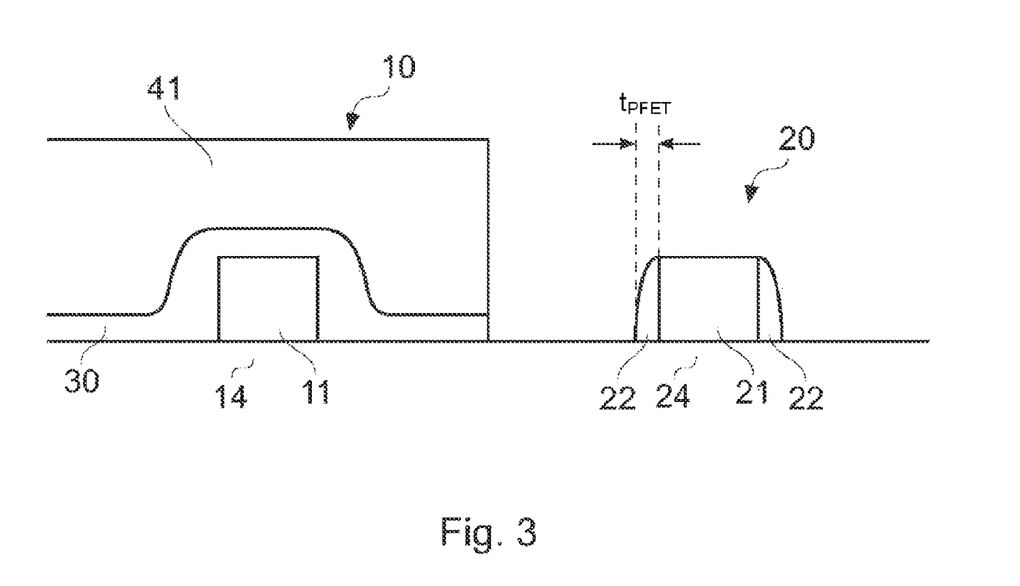

FIG. 3 shows the structure of FIG. 2 following formation of a first mask member 41 above the array of NFET device elements 10 and not above the array of PFET device elements 20. The first mask member 41 may be formed from tetraethoxysilane (TEOS). In some embodiments of the invention, the first mask member 41 may be formed from silicon oxide. Other materials are also useful for fabricating the first mask member 41 including conventional photoresist materials.

The structure may then be subjected to an etch process in order to remove a portion of the first layer 30 thereby to form a pair of sidewall spacer elements 22 on sidewalls of the gate stack structures 21. It will be appreciated that the thickness of the spacer elements 22 on sidewalls of the gate stack structures 21 will depend at least in part on the conditions under which etching is performed, such as the time period for which etching is performed. According to the first embodiment, the etch process may be a reactive ion etch process. Other etch processes are also useful.

According to the first embodiment, the thickness $t_{PFET}$ of the spacer elements 22 on the PFET device elements 20 is preferably around 15 nm. In some embodiments of the invention, the thickness $t_{PFET}$ may be in the range from about 10 nm to about 20 nm. Other thicknesses are also useful.

Figure 4:
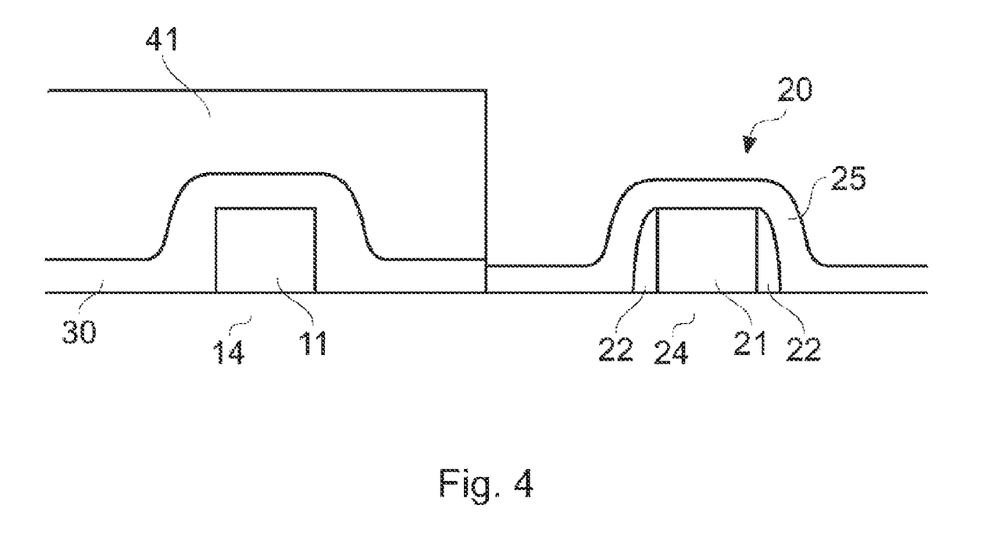

FIG. 4 shows the structure of FIG. 3 following deposition of a stressor layer 25 over the structure. The stressor layer 25 may be a silicon nitride layer having a composition arranged to form a compressive stressed layer. Other materials are also useful for forming the stressor layer 25. The stressor layer is configured to apply a compressive stress to the channel region 24 of each PFET device of the array of PFET devices 20.

Figure 5:
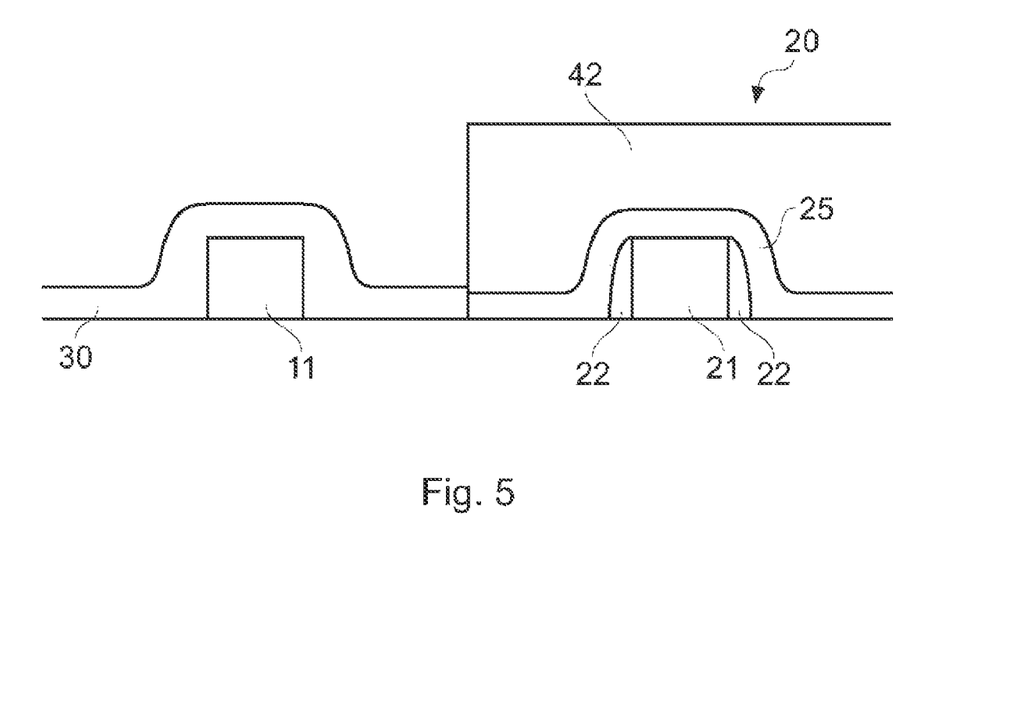

FIG. 5 shows the structure of FIG. 4 following removal of the first mask member 41, thereby exposing the first layer of first material 30 over the array of NFET device elements 10, and the formation of a second mask member 42 over the array of PFET device elements 20.

Figure 6:
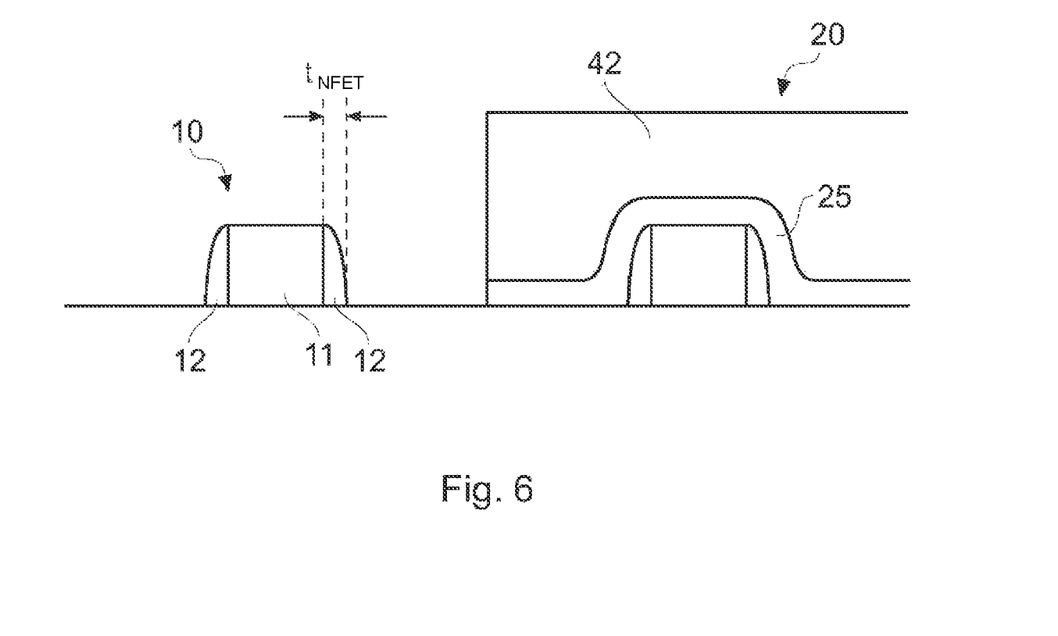

FIG. 6 shows the structure of FIG. 5 following an etch process to remove a portion of first layer 30 thereby to form a pair of sidewall spacer elements 12 on sidewalls of the gate stack structures 11. It will be appreciated that the thickness of the spacer elements 12 on sidewalls of the gate stack structures 11 will depend at least in part on the conditions under which etching is performed, and the time period for which etching is performed. According to the first embodiment, the etch process may be a reactive ion etch process.

According to the first embodiment, the thickness $t_{NFET}$ of the spacer elements 12 on the NFET device elements 10 is preferably around 15 nm. In some embodiments of the invention the thickness $t_{NFET}$ may be in the range from about 10 nm to about 20 nm. Other thicknesses are also useful.

Figure 7:
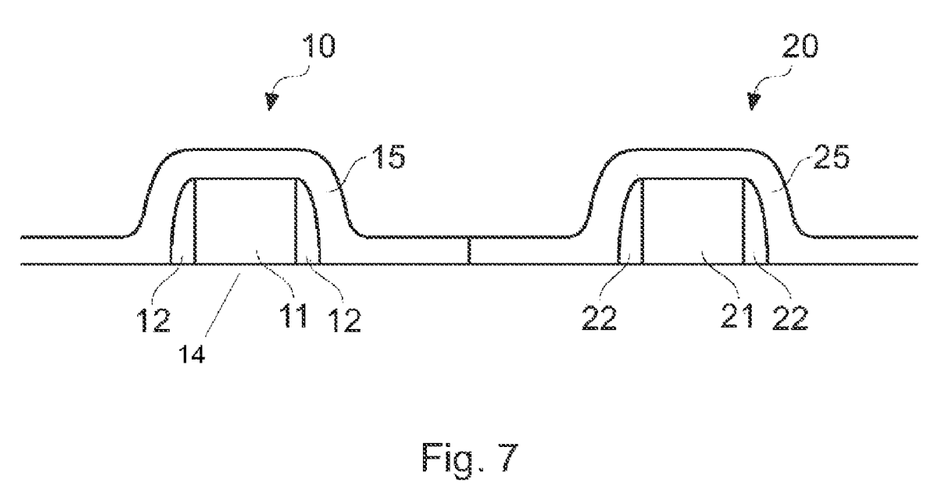

FIG. 7 shows the structure of FIG. 6 following deposition of a stressor layer 15 over the array of NFET elements 10. The second mask member 42 has also been removed, following deposition of the stressor layer 15. The stressor layer 15 is a tensile stressed layer and is arranged to apply a tensile stress to the channel region 14 of each device element of the array of NFET device elements 10.

It will be understood that the first embodiment of the invention allows control of the amount of stress applied to the channel regions of respective arrays of NFET and PFET device elements of an integrated circuit structure.

For example, the amount of stress may be controlled by varying a thickness of spacer elements on gate stack sidewalls of respective arrays. Varying the thickness of the spacer elements allows the distance of the stressor layer 15 from the channel region 14 of each device to be controlled. The closer the stressor layer 15 is to the channel region (i.e. the smaller the spacer width), the greater the stress in the channel region due to the stressor layer 15.

The amount of stress can in addition or alternatively be controlled by varying an amount of stress in the respective stressor layers 15, 25 formed over the respective arrays. The greater the amount of stress in the respective stressor layers 15, 25, the greater the stress in the respective channel regions.

In variations of the first embodiment, spacers formed on sidewalls of the gate stack structures 11, 21 are disposable spacers. The spacers may be formed for the purpose of locating suitable respective different stressors in NFET and/or PFET devices. By forming spacers on sidewalls of the devices having different thicknesses on NFET and PFET device structures, respectively, the stressors have different proximities to the channels of respective devices, thereby enabling control of the amount of stress applied to respective channels. Furthermore, the ability to form spacers with different thicknesses enables tailoring of overlap control for source/drain regions and source/drain extensions for different devices types. Once the stressors are formed, the spacers can be removed and subsequent processing continued.

According to the second embodiment of the invention, a process of forming spacers on sidewalls of the gate stacks of the array of PFET device elements is performed, substantially as described with respect to the first embodiment of the invention (FIGS. 2, 3).

Figure 8:
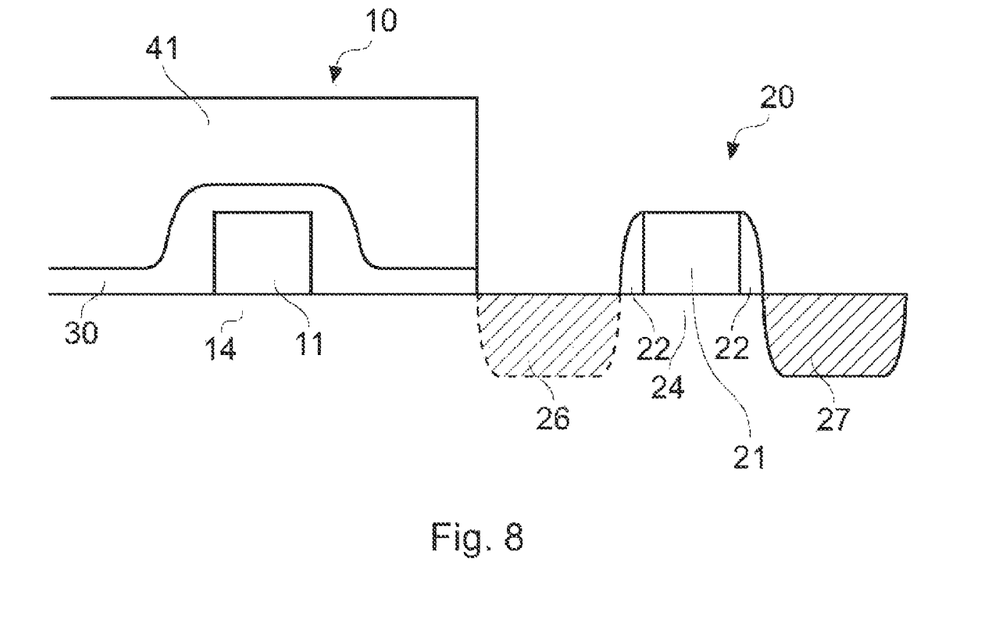
FIGS. 8 to 10 show structures formed during a process of fabricating an integrated circuit according to embodiments of the invention.

FIG. 8 shows the structure of FIG. 3 following implantation of dopant atoms to form doped stressor elements 26, 27 in the source and drain regions, respectively, of the PFET device elements. The stressor elements 26, 27 apply a compressive stress to the channel region 24 of each of the PFET device elements.

According to the second embodiment of the invention the dopant atoms for the PFET devices may be germanium atoms, but other dopant atoms are also useful. For instance, in variations of the second embodiment, the dopant atoms may be tin (Sn) atoms, indium (In) atoms or any other suitable dopant atom alone or in combination having a relatively high atomic size compared with silicon.

Figure 9:
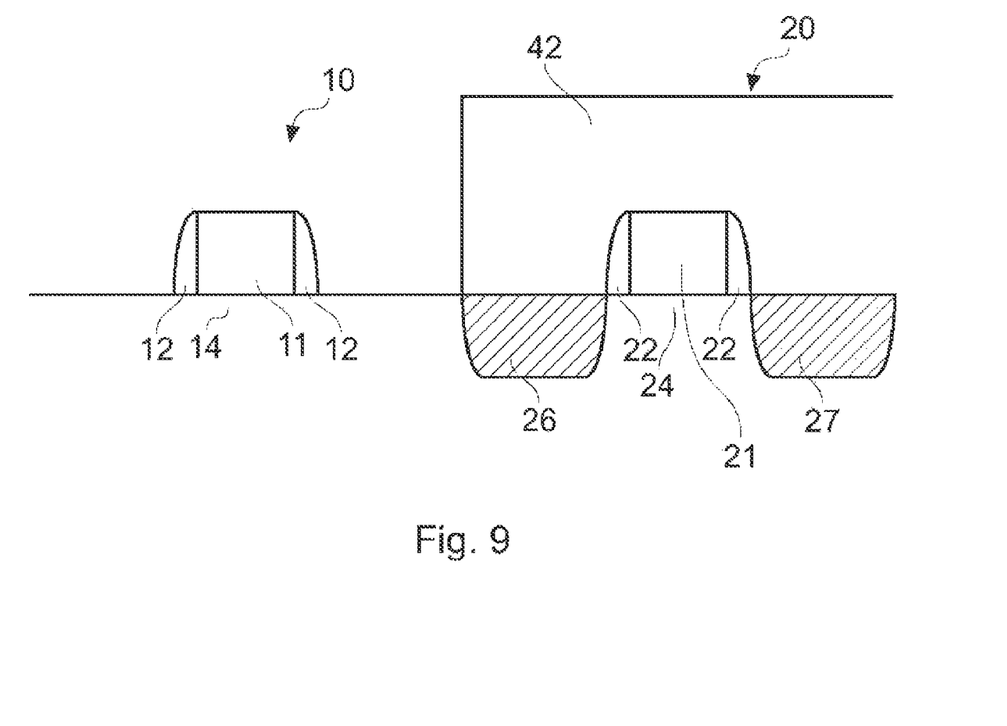

FIG. 9 shows the structure of FIG. 8 following removal of the first mask member 41, and formation of a second mask member 42 over the array of PFET device elements 20. Etching of the first layer 30 to form spacers 12 on sidewalls of each gate stack 11 of the array of NFET device elements 10 has also been performed. Etching of the first layer 30 is performed in a similar manner as that described above with respect to the first embodiment of the invention.

Figure 10:
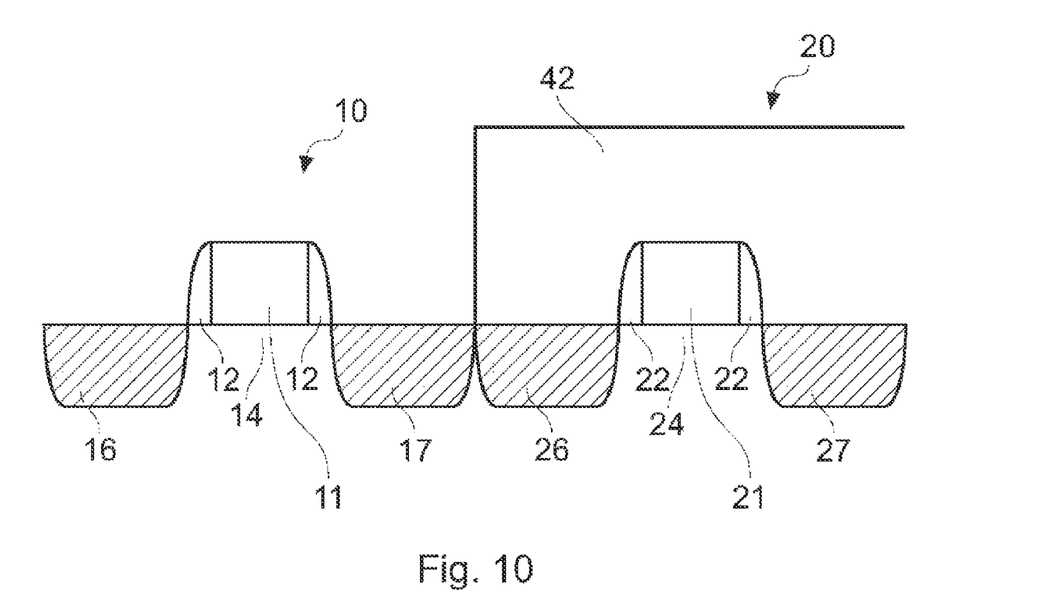

FIG. 10 shows the structure of FIG. 9 following implantation of dopant atoms into the structure to form source and drain stressor elements 16, 17 respectively of the NFET device elements.

According to the second embodiment, the dopant atoms may be carbon atoms, but other dopant atoms are also useful. In variations of the second embodiment, the dopant atoms may be phosphorous atoms, or any other suitable dopant atom alone or in combination having a relatively low atomic size compared with silicon.

The source and drain stressor elements 16, 17 are arranged to apply a tensile stress to the channel region 14 of each NFET device of the array of NFET devices 10.

It will be understood that the second embodiment of the invention allows control of the amount of stress applied to the channel regions of the respective arrays of NFET and PFET device elements of an integrated circuit structure. The amount of stress may be controlled by varying a thickness of spacer elements on gate stack sidewalls of respective arrays as discussed above. The amount of stress can in addition or alternatively be controlled by varying the size of stressor elements 16, 17, 26, 27, and the amount and type of dopant used to form the stressor elements.

According to a third embodiment of the invention, a process of forming spacers on sidewalls of the gate stacks of the array of PFET device elements is performed substantially as described with respect to the first and second embodiments of the invention (FIGS. 2, 3).

Figure 11:
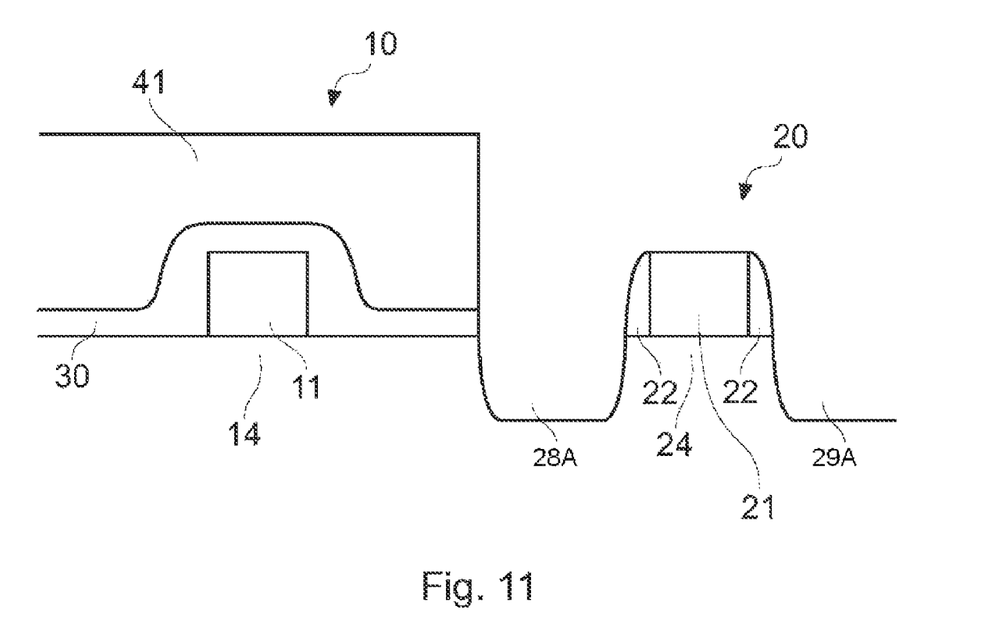
FIGS. 11 to 14 show structures formed during a process of fabricating an integrated circuit according to embodiments of the invention.

FIG. 11 shows the structure of FIG. 3 following a process of etching of the structure to form stressor recess portions 28A, 29A in the source and drain regions of each device element of the array of PFET device elements 20. According to the third embodiment the process of etching the structure to form the stressor recess portions 28A, 29A may be a reactive ion etching process, but other etching processes, such as a well etch process, are also useful.

In each of the first, second and third embodiments, the gate stack sidewall spacer elements 22 may be formed from silicon nitride. The reactive ion etching process may be performed using a reactive ion etching medium that selectively etches silicon and not silicon nitride. Consequently, etching of the substrate of the structure occurs and not etching of the gate stack sidewall spacer elements 22.

In some embodiments of the invention, the RIE medium may be of low selectivity between silicon and silicon nitride. In this case, the spacer thickness as deposited is thicker, in order to achieve a target spacer width.

Figure 12:
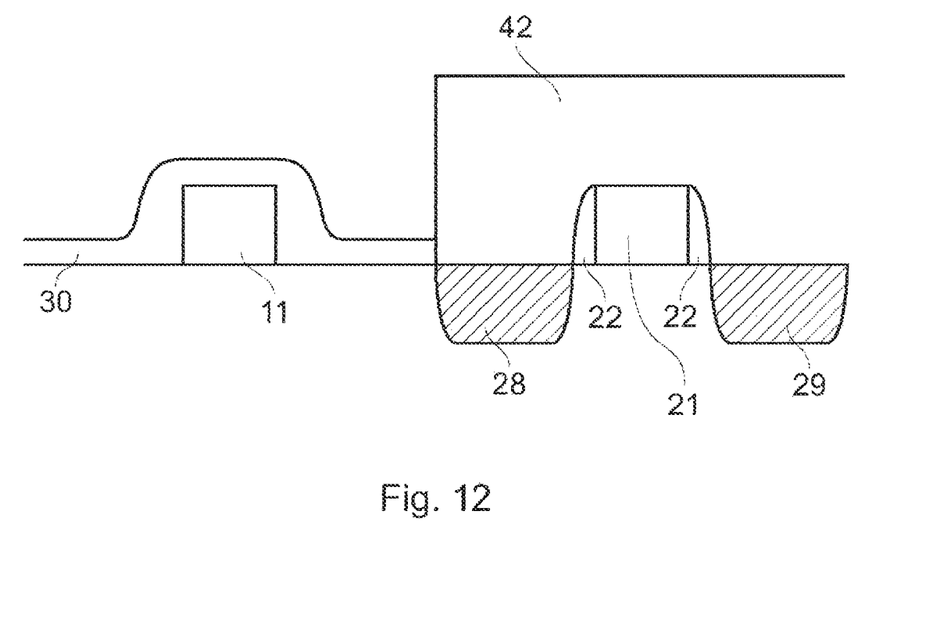

FIG. 12 shows the structure of FIG. 11 following a process of forming a stressor material in the stressor recess portions 28A, 29A of the device elements of the array of PFET device elements 20. By means of this process, stressor elements 28, 29 are formed in stressor portions 28A, 29A respectively. The stressor material is arranged to apply a compressive stress to the channel region 24 of each PFET device element of the array of PFET device elements 20.

According to the third embodiment of the invention, the stressor material may be epitaxial silicon germanium. In variations of the third embodiment, the stressor material may instead be silicon germanium carbon, silicon tin, silicon indium germanium, or any other functionally equivalent stressor material.

According to the third embodiment, the stressor material may be formed by chemical vapour deposition (CVD). Other deposition processes are also useful.

The first mask member 41 is then removed, and a second mask member 42 formed over the array of PFET device elements 20. The second mask member 42 is also shown in FIG. 12.

Figure 13:
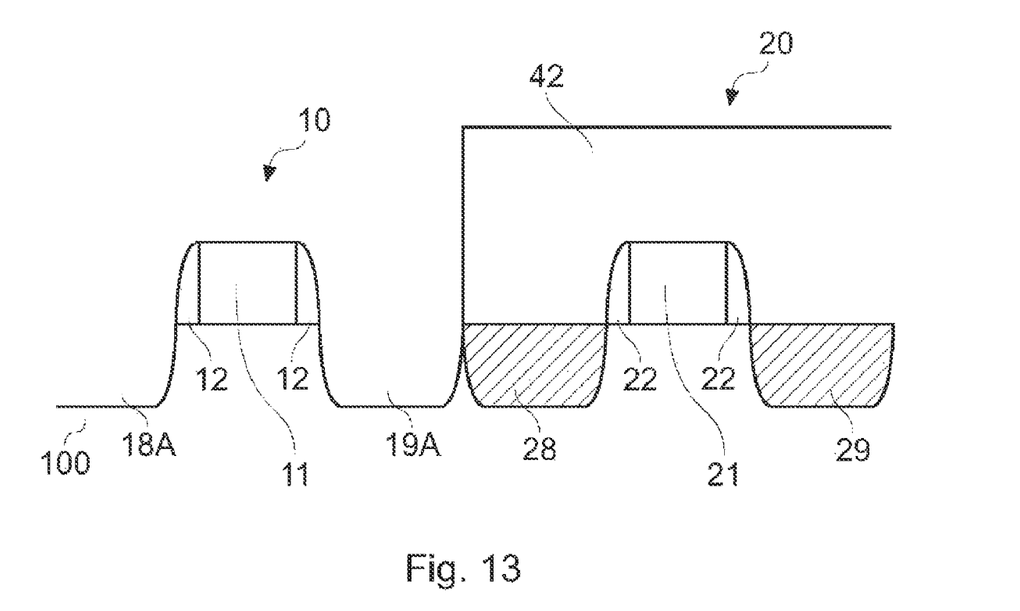

FIG. 13 shows the structure of FIG. 12 following a process of etching the first layer 30 to form spacer elements 12 on sidewalls of the gate stack 11 of each device element of the array of NFET device elements 10.

Etching of the first layer may be performed by means of a reactive ion etching process but other etching processes are also useful.

Following etching of the first layer 30, further etching of the structure is performed in order to form stressor recess portions 18A, 19A of each of the NFET devices. According to the first embodiment, etching of the stressor recess portions 18A, 19A may be performed by means of a reactive ion etching process. The reactive ion etching process may be performed using a reactive ion etching medium that selectively etches silicon and not silicon nitride. Consequently, etching of the substrate 100 of the structure occurs and not etching of the gate stack sidewall spacer elements 12.

It will be appreciate that in the case that spacer elements 12, 22 are fabricated from a material other than silicon nitride, a different etch medium may be required. Similarly, in embodiments where the substrate is not a silicon substrate, a different etch medium may be required.

Figure 14:
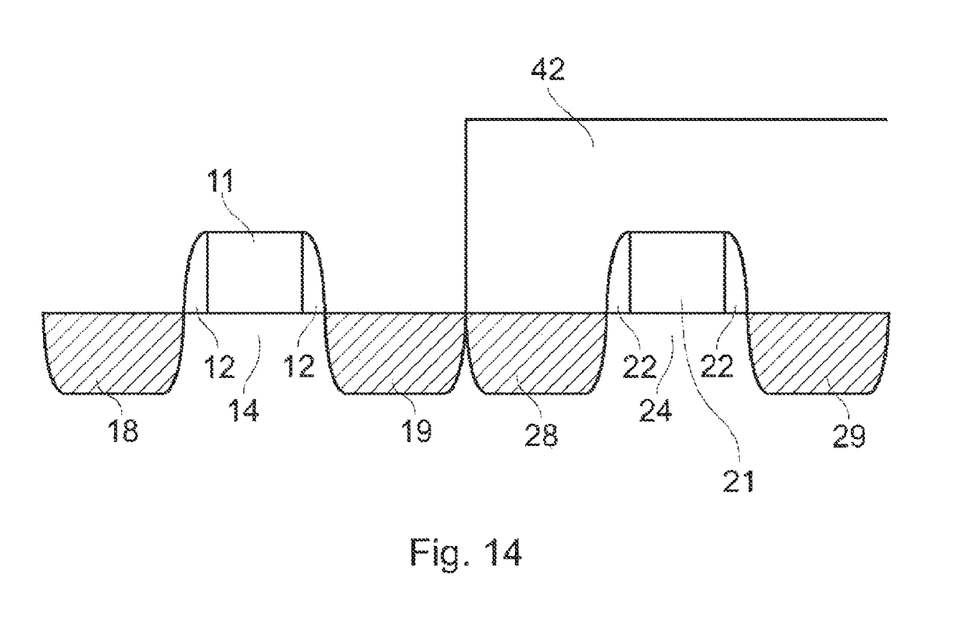

FIG. 14 shows the structure of FIG. 13 following formation of a stressor material in the stressor recess portions 18A, 19A of each device element of the NFET device elements 10. By means of this process, stressor elements 18, 19 are formed in stressor recess portions 18A, 19A, respectively. The stressor material is arranged to apply a tensile stress to the channel region 14 of each NFET device element of the array of NFET device elements 10.

According to the third embodiment, the stressor material may be silicon carbon. In variations of the third embodiment, the stressor material may instead be silicon carbon phosphorous, silicon phosphorous, or any other suitable stressor material alone or in combination.

In various aspects of the invention, device elements of NFET type and device elements of PFET type are formed having different thickness spacers on respective types of devices.

Furthermore, various aspects of the invention enable a reduction in the number of mask steps that are required in order to form an integrated circuit having strained channel NFET and PFET device elements. For example, in the case that it is required to form an integrated circuit having strained channel NFET and PFET devices, the steps of etching of a first layer to form gate stack sidewall spacers and etching the substrate to form stressor recesses can be performed without a requirement for an intervening masking step.

In other words, once a first layer has been etched to form the gate stack sidewall spacers, it is not necessary to provide a further mask before a process of etching the substrate to form source and drain stressor recesses is performed. This is because the presence of the first layer over the gate stack will protect the gate stack from being etched. Furthermore, the presence of the mask member over a subset of the devices of opposite type to those being etched will protect said subset of devices of opposite type from being etched. This enables stressor recesses of different sizes to be formed adjacent the gate stacks of respective NFET and PFET device elements.

Various aspects of the invention also enable the first layer to be etched to form sidewall spacers and the silicon substrate to be etched to form stressor recesses in a single wafer processing run. This is because in some embodiments of the invention the wafer does not need to be removed from the chamber or other environment in which etching of the first layer is performed in order for etching of the substrate to be performed.

For example, in some embodiments of the invention, the wafer may be subjected to an etching process in a process chamber using a first gas to etch the first layer. Subsequently, the wafer may be subjected to an etching process in the same process chamber using a second gas different from the first gas, in order to etch the substrate.

It will be appreciate that the third embodiment of the invention and variations thereof have the advantage that etching of stressor recesses may be performed in the same hardware module. That is, the process of etching to form the spacers and the process of etching to form the stressor recesses can be performed one after the other in a single run. In other words, there is no need for a process of removal or formation of a mask in between the steps of etching to form the spacers and etching to form the stressor recesses.

In some embodiments of the invention, a continuous etching process is performed in which the etching conditions are changed when etching of the first layer to form the sidewall spacer elements is complete. For example, in some embodiments the etchant gas may be switched from a first layer etch gas to a substrate etch gas. In some embodiments, the etching process may be interrupted following etching of the first layer to form sidewall spacers and before etching of the stressor recesses.

Embodiments of the present invention have been described in which the first mask member is formed over the array of NFET device elements and the second mask member is subsequently formed over the array of PFET device elements. It will be appreciated by those skilled in the art that the first mask member could instead be formed over the array of PFET device elements and the second mask member subsequently formed over the array of NFET device elements.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith.

What is claimed is:

1. A method of forming an integrated circuit structure comprising:
   providing a substrate;
   forming a first and second device region on a surface of the substrate;
   forming first spacers of a first width on sidewalls of a first gate stack in said first device region;
   forming second spacers of a second width on sidewalls of a second gate stack in said second device region;
   forming first source/drain stressor elements in a first source/drain stressor region in the substrate adjacent to the first gate stack with the first spacers, wherein the first source/drain stressor elements have a first proximity to a first channel in the substrate below the first gate stack determined by the first spacers; and
   forming second source/drain stressor elements in a second source/drain stressor region in the substrate adjacent to the second gate stack with the second spacers, wherein the second source/drain stressor elements have a second proximity to a second channel in the substrate below the second gate stack determined by the second spacers.

2. A method as claimed in claim 1 wherein said first device region comprises a n-type transistor and said second device region comprises a p-type transistor.

3. A method as in claim 1 wherein:
   forming the first spacers of a first width further comprises forming, in a single run, the first source/drain stressor elements for applying a stress to the first channel region; and
   forming the second spacers of a second width further comprises forming, in a single run, the second source/drain stressor elements for applying a stress to the second channel region.

4. A method as claimed in claim 3 wherein the step of forming said source/drain stressor elements comprises the steps of:
   forming a source and a drain stressor recess, respectively in said source/drain stressor region associated with said first gate stack and forming a first material in said recesses of said first gate stack; and
   forming a source and a drain stressor recess, respectively, in said source/drain stressor region associated with said second gate stack and forming a second material in said recesses of said second gate stack.

5. A method as claimed in claim 4 wherein said first gate stack comprises a gate stack of an n-type transistor and said second gate stack comprises a gate stack of a p-type transistor, the method further comprising the step of
   forming a tensile stressor material in said stressor recesses associated with said n-type transistor; and
   forming a compressive stressor material in said stressor recesses associated with said p-type transistor.

6. A method as claimed in claim 3 wherein:
   the step of forming said second source/drain stressor element comprises the step of forming a second stressor layer over said second device region; and
   the step of forming said first source/drain stressor element comprises the step of forming a first stressor layer over said first device region.

7. A method as claimed in claim 1 wherein:
   said first width is different from said second width.

8. A method as claimed in claim 1 wherein forming said first source/drain stressor elements comprises implanting a first material into said first source/drain stressor region and forming said second source/drain stressor elements comprises implanting a second material into said second source/drain stressor region.

9. The method of claim 1 wherein the step of forming said first and second spacers comprises:
depositing a spacer layer over the substrate covering the first and second regions;
forming a first mask layer over the substrate;
patterning the first mask layer to remove a first portion of the first mask layer to expose the spacer layer in the first region and leaving a second portion of the first mask layer covering the second region;
patterning the spacer dielectric layer exposed by the first mask layer in the first region to form the first spacers of a first width;
removing the second portion of the first mask layer;
forming a second mask layer over the substrate;
patterning the second mask layer to remove a first portion of the second mask layer to expose the spacer layer in the second region and leaving a second portion of the second mask layer covering the first region; and
patterning the spacer dielectric layer exposed by the second mask layer in the second region to form the second spacers of a second width.

10. A method as claimed in claim 9 wherein widths of said first and second spacers are different.

11. A method for processing a semiconductor structure comprising:
forming, in a single run, one or more spacers of different widths for different devices and
forming source/drain recesses adjacent to a gate in the devices and filling the source/drain recesses with a filler material to form stressors for applying tensile or compressive stress on the devices.

12. A method of forming a device comprising:
providing a substrate prepared with a first device region with a first gate and a second device region with a second gate;
selectively forming first spacers of a first width on sidewalls of the first gate;
selectively forming first stressors in the first device region by forming first source/drain recesses in the substrate adjacent to the first gate and filling the first source/drain recesses with a first filler material to form first source/drain stressors, the first stressors comprising a first stress;
selectively forming second spacers of a second width on sidewalls of the second gate in the second device region after selectively forming the first spacers and the first stressors; and
selectively forming second stressors in the second device region, the second stressors comprising a second stress.

13. The method of claim 12 wherein forming the first stressors comprises forming a first stress layer over the first device region.

14. The method of claim 13 wherein forming the second stressors comprises forming a second stress layer over the second device region.

15. The method of claim 12 wherein forming the first stressors comprises implanting first type ions into first source/drain regions adjacent to the first gate, the first type ions form first source/drain stressor regions having the first stress.

16. The method of claim 15 wherein forming the second stressors comprises implanting second type ions into second source/drain regions adjacent to the second gate, the second type ions form second source/drain stressor regions having the second stress.

17. The method of claim 12 wherein forming the second stressors comprises:
forming second source/drain recesses in the substrate adjacent to the second gate; and
filling the second source/drain recesses with a second filler material to form second source/drain stressors comprising the second stress.

18. The method of claim 12 wherein one of the first and second stresses comprises a tensile stress and other of the first and second stresses comprises a compressive stress.

19. The method of claim 12 wherein:
the first width is selected to cause the first stress to apply a first desired amount of the first stress on a first channel beneath the first gate; and
the second width is selected to cause the second stress to apply a second desired amount of the second stress on a second channel beneath the second gate.

20. The method of claim 19 wherein the first width of the first spacers is different from the second width of the second spacers.

21. A method of forming a device comprising:
providing a substrate with first and second device regions;
forming first spacers of a first width on sidewalls of a first gate stack in the first device region;
forming second spacers of a second width on sidewalls of a second gate stack in the second device region; and
forming first source/drain stressor elements in a first source/drain stressor region in the substrate adjacent to the first gate stack with the first spacers, wherein the first source/drain stressor elements have a first proximity to a first channel in the substrate below the first gate stack determined by the first spacers.

22. The method of claim 21 comprises forming second source/drain stressor elements in a second source/drain stressor region in the substrate adjacent to the second gate stack with the second spacers, wherein the second source/drain stressor elements have a second proximity to a second channel in the substrate below the second gate stack determined by the second spacers.

23. The method of claim 21 wherein forming first source/drain stressor elements comprises forming first source/drain recesses in the substrate adjacent to the first gate stack and filling the first source/drain recesses with a first filler material to form the first source/drain stressor elements.

24. The method of claim 21 wherein forming first source/drain stressor elements comprises implanting first type ions into first source/drain regions adjacent to the first gate stack, the first type ions form the first source/drain stressor region.

* * * * *